US011852691B2

(12) United States Patent
O'Connell et al.

(10) Patent No.: US 11,852,691 B2
(45) Date of Patent: Dec. 26, 2023

(54) INPUT/OUTPUT (IO) MODULE POWER SUPPLY WITH ONLINE LOAD TEST CAPABILITY

(71) Applicant: Rockwell Automation Technologies, Inc., Mayfield Heights, OH (US)

(72) Inventors: John R. O'Connell, Painesville, OH (US); Edward C. Hopsecger, Mentor, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 155 days.

(21) Appl. No.: 17/410,659

(22) Filed: Aug. 24, 2021

(65) Prior Publication Data

US 2023/0065352 A1 Mar. 2, 2023

(51) Int. Cl.
*G01R 31/40* (2020.01)
*H02M 1/00* (2006.01)
*H02M 1/08* (2006.01)
*H02M 3/155* (2006.01)

(52) U.S. Cl.
CPC .......... *G01R 31/40* (2013.01); *H02M 1/0009* (2021.05); *H02M 1/08* (2013.01); *H02M 3/155* (2013.01)

(58) Field of Classification Search
CPC ...... G01R 31/40; H02M 1/0009; H02M 3/155
See application file for complete search history.

(56) References Cited

U.S. PATENT DOCUMENTS

| | | | |
|---|---|---|---|
| 4,520,416 A | 5/1985 | Karash | |
| 5,036,452 A | 7/1991 | Loftus | |
| 6,411,119 B1 | 6/2002 | Feldtkeller | |
| 7,652,393 B2 | 1/2010 | Moth | |
| 8,772,964 B2 | 7/2014 | Beg et al. | |
| 9,093,860 B2 | 7/2015 | Beg | |
| 9,172,271 B2 | 10/2015 | Beg et al. | |
| 9,594,097 B2* | 3/2017 | Bogner | G01R 1/20 |
| 9,735,692 B1 | 8/2017 | Lu et al. | |
| 10,082,856 B1 | 9/2018 | Owen et al. | |

(Continued)

FOREIGN PATENT DOCUMENTS

| | | |
|---|---|---|
| CN | 110879565 A | 3/2020 |
| DE | 19814097 C1 | 3/2000 |

(Continued)

OTHER PUBLICATIONS

Extended European Search Report for Application No. 22198001.4 dated Feb. 21, 2023, 10 pages.

(Continued)

*Primary Examiner* — Kyle J Moody

(74) *Attorney, Agent, or Firm* — Fletcher Yoder, P.C.

(57) ABSTRACT

Embodiments of this present disclosure include an input/output (IO) power supply module coupled to a load. The IO power supply module may include testing circuitry that couples to a voltage supply of the IO power supply module. The testing circuitry may perform an online load current test to verify performance of IO power supply module. To do so, the testing circuitry may include a current measurement circuit coupled to a switch. The current measurement circuit may receive a current via the switch while closed to determine whether the output current generated by the voltage supply is equal to a rated output current.

20 Claims, 4 Drawing Sheets

(56) References Cited

U.S. PATENT DOCUMENTS

| | | | |
|---|---|---|---|
| 10,631,426 B1 | 4/2020 | Lostoski et al. | |
| 10,684,611 B2 | 6/2020 | O'Connell et al. | |
| 10,838,386 B1 | 11/2020 | Wrobel et al. | |
| 10,985,477 B1 | 4/2021 | Wrobel et al. | |
| 10,986,748 B1 | 4/2021 | Wrobel et al. | |
| 2003/0204777 A1 | 10/2003 | Kojori | |
| 2009/0267582 A1 | 10/2009 | Prodic et al. | |
| 2010/0007216 A1* | 1/2010 | Chojecki | H03K 17/0822 307/115 |
| 2011/0184579 A1 | 7/2011 | Nilsen et al. | |
| 2012/0098338 A1 | 4/2012 | Lew et al. | |
| 2013/0138365 A1 | 5/2013 | Etaati et al. | |
| 2015/0331468 A1 | 11/2015 | Jau et al. | |
| 2018/0052503 A1 | 2/2018 | Sharma et al. | |
| 2018/0252777 A1 | 9/2018 | Straub | |
| 2018/0292801 A1 | 10/2018 | Tonet | |
| 2018/0351547 A1* | 12/2018 | Chawla | G01R 19/25 |
| 2019/0366953 A1 | 12/2019 | Ganireddy et al. | |
| 2020/0303922 A1 | 9/2020 | Fukuhara et al. | |
| 2021/0148968 A1 | 5/2021 | Wells et al. | |
| 2023/0015527 A1 | 1/2023 | Zipf | |

FOREIGN PATENT DOCUMENTS

| | | |
|---|---|---|
| DE | 102004034451 A1 | 2/2006 |
| EP | 0985987 A2 | 3/2000 |
| EP | 3798769 A1 | 3/2021 |
| GB | 2567650 B | 4/2019 |
| JP | H06120787 A | 4/1994 |
| JP | 2017050933 A | 3/2017 |

OTHER PUBLICATIONS

Extended European Search Report for Application No. 22198006.3 dated Feb. 10, 2023, 12 pages.

Extended European Search Report for Application No. 22189913.1 dated Feb. 20, 2023, 8 pages.

Patoka, M., "Fundamentals of power system ORing," EETimes, https://www.eetimes.com/fundamentals-of-power-system-oring/, published Mar. 21, 2007, 6 pages.

U.S. Appl. No. 17/485,830, filed Sep. 27, 2021, Stephen E. Denning.

U.S. Appl. No. 17/485,849, filed Sep. 27, 2021, Stephen E. Denning.

Extended European Search Report for Application No. 22205345.6 dated Apr. 5, 2023, 10 pages.

\* cited by examiner

INPUT/OUTPUT (IO) MODULE POWER SUPPLY WITH ONLINE LOAD TEST CAPABILITY

BACKGROUND

This disclosure generally relates to systems and methods for input/output (IO) module power supplies within industrial automation systems. More particularly, embodiments of the present disclosure are directed toward providing power to a load from concurrently operating IO module power supplies of the industrial automation systems.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

Industrial automation systems may include automation control and monitoring systems. The automation control and monitoring systems may monitor statuses and/or receive sensing data from a wide range of devices, such as valves, electric motors, various types of sensors, other suitable monitoring devices, or the like. In addition, one or more components of the automation control and monitoring systems, such as programming terminals, automation controllers, input/output (IO) modules, communication networks, human-machine interface (HMI) terminals, and the like, may use the statuses and/or collected information to provide alerts to operators to change or adjust an operation of one or more components of the industrial automation system (e.g., such as adjusting operation of one or more actuators), to manage the industrial automation system, or the like.

The automation control and monitoring systems may change how a load is operated based on the monitored statuses or sensing data. To do so, an automation control and monitoring system may change control signals supplied to the networked devices, which may control whether a power supply provides power to a load downstream of the power supply. For example, power-enabled IO modules (e.g., IO power processing modules) may supply power to one or more loads coupled downstream. Over time, physical material forming the IO power module may degrade, components of the IO power module may operate erroneously, or the like. These types of issues that may be incurred by the IO power module may cause a current output by the IO power module to decay or decrease, such that the current output no longer complies with a desired current rating for the IO power module.

To test for undesirable current outputs, the load may be powered on via the IO power module to verify that the current levels output by the IO module meet the current rating of the load. Keeping this in mind, it should be noted that, in some situations, it may be undesirable to power on a load for performing routine testing of the IO power module in industrial automation systems where equipment is continuously operating to perform manufacturing and other automation tasks. As such, improved systems and methods for load current testing of devices within industrial automation systems may be desired.

SUMMARY

A summary of certain embodiments disclosed herein is set forth below. It should be understood that these aspects are presented merely to provide the reader with a brief summary of these certain embodiments and that these aspects are not intended to limit the scope of this present disclosure. Indeed, this present disclosure may encompass a variety of aspects that may not be set forth below.

In one embodiment, a system may include a voltage supply that may supply an output current to a load and testing circuitry coupled to the voltage supply. The testing circuitry may include an additional voltage supply, a switch, and a current measurement circuit, the switch may close in response to a voltage signal from the additional voltage supply. The current measurement circuit may be coupled to the switch. The current measurement circuit may receive the output current from the voltage supply while the switch is closed. Furthermore, the system may include a control system that receives an indication of a voltage across the current measurement circuit while the switch is closed from a sensing circuit, that determines an amount of current present in the output current based on a resistance value associated with the current measurement circuit and the voltage, and that performs an operation based on the amount of current.

In another embodiment, a test circuit may include a voltage supply and a switch. The switch may close in response to receiving a voltage signal from the voltage supply. The test circuit may also include a timing circuit coupled to the voltage supply and to a ground terminal. The timing circuit may limit an amount of time that the voltage signal is provided to the switch. The test circuit may also include a current measurement circuit coupled to the switch. The current measurement circuit may receive an output current from an additional voltage supply while the switch is closed during the amount of time and the additional voltage supply may provide power to a load.

In yet another embodiment, a tangible, non-transitory computer-readable medium may store instructions executable by a processor of an electronic device that, when executed by the processor, cause the processor to perform operations including receiving an indication of a request to validate an output current of a first input/output (IO) power supply module that couples to a load. The operations may include closing a switch for a duration of time in response to the indication of the request and detecting a voltage across one or more resistors coupled between the switch and a ground terminal. The operations may include determining an amount of current present in an output current transmitted via the one or more resistors based on a resistance value of the one or more resistors and the voltage. Furthermore, the operations may include transmitting a notification in response to a difference between the amount of current and a rated output current being greater than a threshold amount.

DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
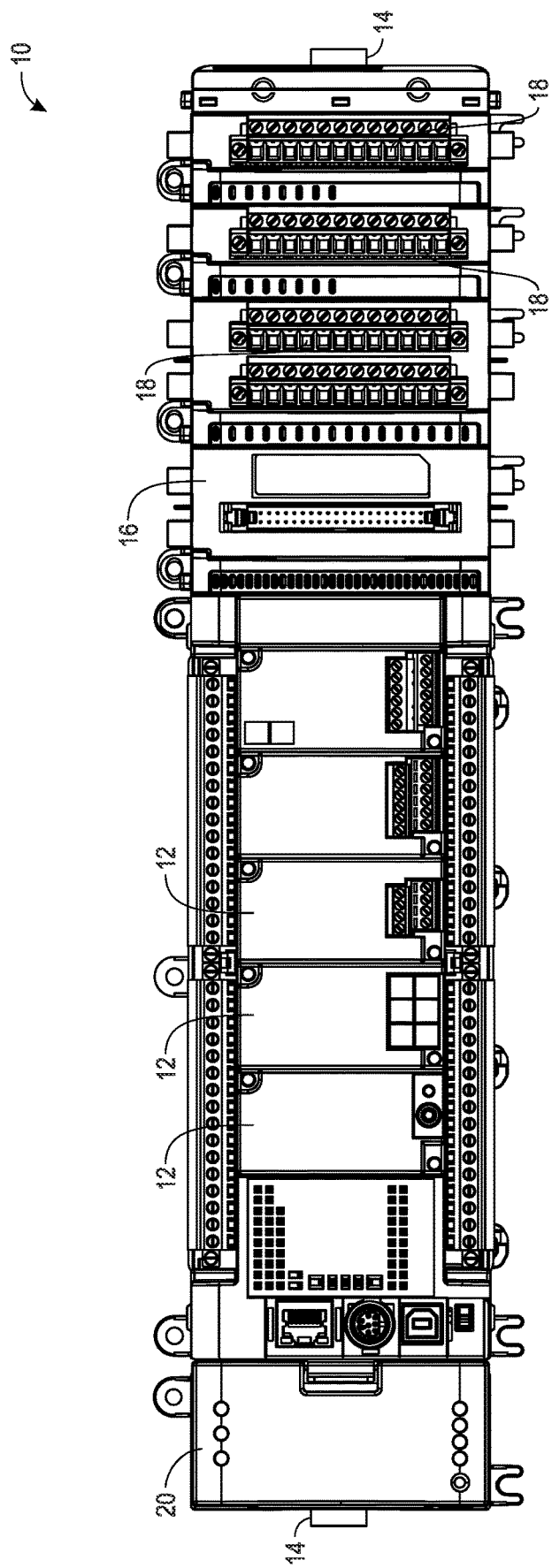
FIG. 1 is a perspective view of an example distributed processing system, in accordance with an embodiment.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. One or more specific embodiments of the present embodiments described herein will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The present disclosure is generally directed towards systems and methods that test a load current output of an input/output (IO) power supply module without interrupting the operations performed by or the power received by a load coupled downstream from the IO power supply module.

Within an industrial automation system, certain components may be used occasionally, such as in response to a certain event occurring, a condition being detected, or the like. As such, these systems may lie dormant for extended periods of time (e.g., greater than a threshold amount of time) before being used. For example, a redundant power supply, a fire suppressant system, an alarm system, or the like may be used on occasion in an industrial automation system, as opposed to a periodic nature or according to a schedule. An industrial automation system that includes such devices may benefit from having routine operational checks performed on the devices, such as to verify operational status periodically or according to a maintenance schedule. These operational checks may include powering the load or operating the device to verify its operation. Sometimes, it may not be feasible or desirable to validate operations by powering the load. For example, a fire suppressant system, such as one located in a room with electrical equipment, indoors, or the like, may benefit from validation operations to ensure that the equipment is performing according to its design specifications. However, performing validation operations on these types of systems may result in the equipment being rendered inoperable for future tasks. For instance, after testing a first suppressant system, the fire suppressant system may disperse water, foam, air, sand, or other material from its reserve, thereby extinguishing the fire suppressant supplies for future operations.

Another example of systems where it may be difficult or undesirable to perform physical validation operations include testing redundant power supplies concurrently providing power to the same load. For example, a secondary power supply may back up a primary power supply, such that the secondary power supply and the primary power supply may concurrently provide the same voltage to a shared load, such as an input/output (IO) power module pair. Since both of the supplies continuously provide the same voltage amount to the shared load, the load may be seamlessly switched between the primary power supply and secondary power supply without causing any interruption. Indeed, if the primary power supply become unavailable, the secondary power supply may replace the primary power supply as the power source to the load. Furthermore, since both power supplies continuously and concurrently provide the same voltage, it may be difficult or undesirable to take either power supply offline for validation testing. That is, when testing the viability of one of the two power supplies, a non-operational component of the power supply being tested may become the source of an undesired current output provided to a load that relies the current for operation, thereby jeopardizing the operation of the load.

To remedy this, systems and methods described herein relate to online validation testing that do not disrupt concurrent power supply operations. To test the load current output of an IO power supply module, the load may be coupled to two or more IO power supply modules to provide a redundant power supply. Each IO power supply module may include a test circuit that enables the respective IO power supply module to test the ability of its respective voltage supply to output a current. The respective testing circuitry of the IO power supply module may perform an online current load test to verify the performance of the respective IO power supply module while the load is drawing the output current from another IO power supply module. In this way, the load may continue to operate while one of the IO power supply modules is being tested. To perform the current testing, the testing circuitry of the IO power module being tested may include a switch that closes in response to receiving a pulsed voltage signal. The switch may then connect the respective voltage supply of the IO power module being tested to one or more resistors coupled to the switch. The resistors may receive a current via the voltage supply and the switch, thereby generating a voltage across the one or more resistors. A control system may use the voltage to calculate the current output by the respective voltage supply and determine whether the current generated by the voltage supply is equal to or substantially similar to a rated output current value for the voltage supply.

The testing circuitry described herein also further improves testing operations of IO power modules since the testing circuitry uses relatively small footprints when installed within an IO power module. Indeed, the circuitry described herein permits a power supply to have its output tested without turning on or turning off its load. By reducing the complexity of validating outputs from power supplies, a power supply that operates in an undesired way may be less likely to go undetected.

By way of introduction, FIG. 1 is a perspective view of an example distributed processing system 10. The distributed processing system 10 may be included within an industrial automation system to help perform operations, make control decisions, to instruct performance of an operation in response to sensed data, to implement a control loop, or the like. The distributed processing system 10 may be a processing system that uses one or more computing devices or processors to perform one or more operations. The distributed processing system 10 includes several processing modules 12 (e.g., processing devices). The processing modules 12 may interconnect with each other via a communication bus 14 (e.g., a shared communication bus). The communication bus 14 is disposed on one side of the processing modules 12, and, although not depicted, may be coupled to each of the processing modules 12 via a suitable backplane, input/output (IO) circuitry, or the like.

Each of the processing modules 12 may perform one or more operations that contribute to an industrial control system operation and may include any combination of hardware circuitry and/or software-based operations. For example, one of the processing modules 12 may include a processor(s) and memory storing instructions readable by the processor to cause the processor to perform an operation of the one or more operations. Thus, the processing module 12 may include a tangible, non-transitory, computer-readable medium that stores instructions to cause the processing module 12 to perform an operation on an industrial automation system.

The processing modules 12 may perform control functions, power stage functions, analytics engine functions, programmable logic controller logic functions, or the like. Control functions may include operations that generate output control signals in response to one or more inputs. Power stage functions may include operations that cause, in response to one or more inputs, to modify the operations of the distributed processing system 10 and/or a component of the distributed processing system 10. In some cases, power stage functions may operate to provide or permit electrical signals to a load or other component coupled to a processing module 12 performing the power stage function. Analytics engine functions may include operations that receive inputs and analyze the inputs to determine a conclusion. Analysis of the inputs may include historic trending of inputs over time, comparison between input values, comparison between input values over time, or the like. The analysis may cause a processing module 12 to diagnose or detect abnormal operation in advance of a fault or other abnormal operation-related event. Programmable logic controller (PLC) logic functions may include operations that generate outputs to be used in PLC operations. These outputs may include control signals and/or data signals referenced by the PLC to determine when certain electric and/or mechanical components to close or open. Other suitable operations may be performed by one or more of the processing modules 12.

The distributed processing system 10 may also include an input/output block (IO block) 16. The IO block 16 may include termination points 18 where an input or an output communicative coupling may be secured. In the depicted example, the termination points 18 are screw-in terminations, where a screw-based coupling secures the input or output communicative coupling to a conductive terminal. Other types of terminations may be used, including plugs, clasps, or the like.

Each of the components of the distributed processing system 10 may be powered using electrical signals from a power supply 20. The power supply 20 may be coupled to a common power supply that supplies the electrical signals through a power bus onto each of the other components, or via another suitable electrical connection.

Figure 2:
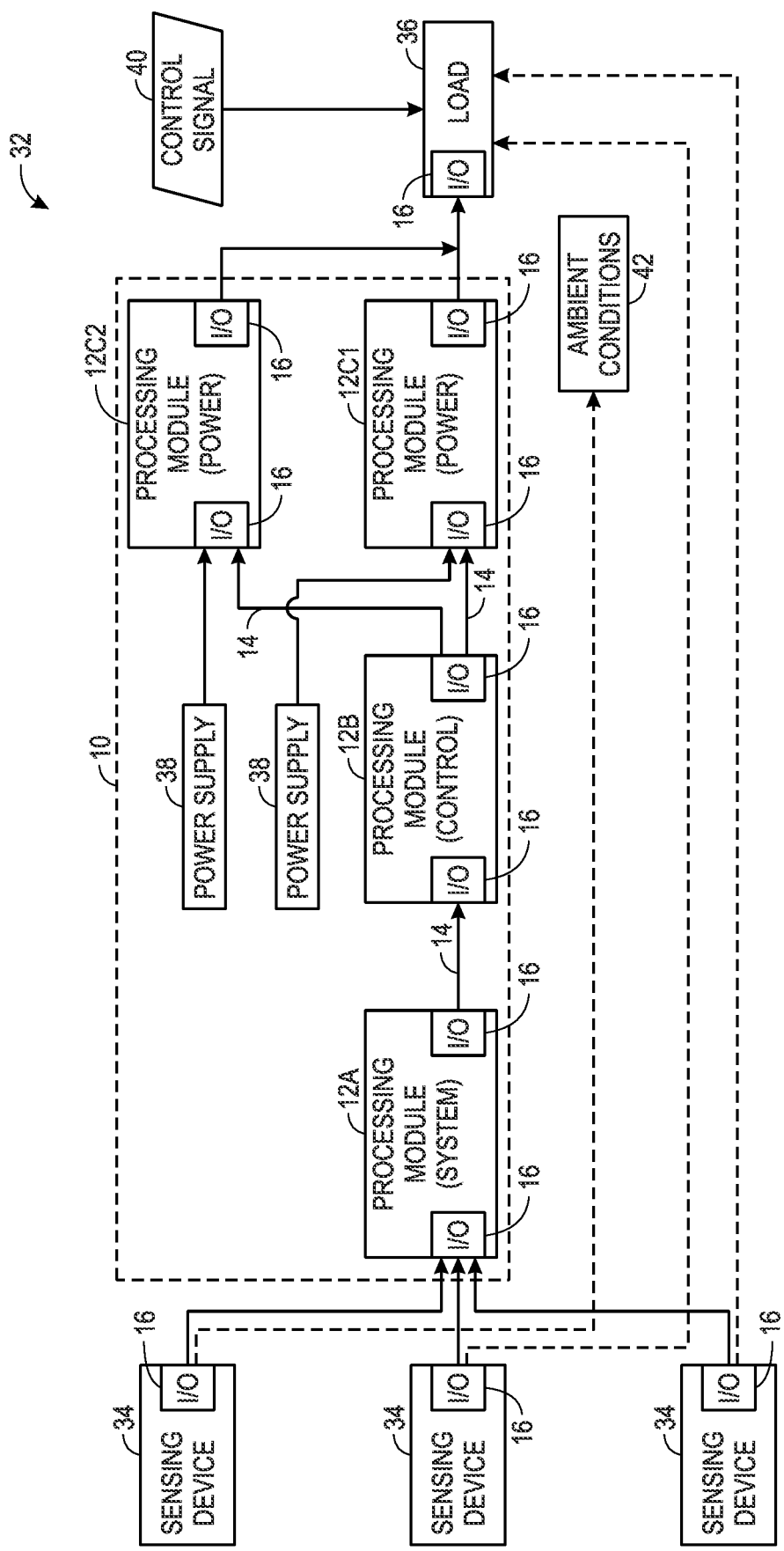
FIG. 2 is a block diagram of an example industrial automation system that includes the distributed processing system of FIG. 1, in accordance with an embodiment.

Some of the components of the distributed processing system 10 may be generalized in a block diagram shown in FIG. 2. Referring now to FIG. 2, an example industrial automation system 32 that includes the distributed processing system 10 is illustrated. The industrial automation system 32 may include sensing devices 34 coupled to the distributed processing system 10. The distributed processing system 10 may couple to a load 36. As such, the load 36 may receive analog electrical (e.g., voltage) signals via in/out connections of IO block 16, digital signals via in/out connection of the IO block 16, or both. In some embodiments, an output from the distributed processing system 10 may adjust operation of the IO power processing modules 12C to change operation of the load 36. For example, the distributed processing system 10 may determine to slow a rotation of a motor (e.g., load 36), and, to do so, may send a request to at least one of IO power processing modules 12C to modify electrical signal(s) supplied to the motor as a control operation (e.g., electrical signals received via IO block 16 and output to load 36).

Although described as a motor, the load 36 may be a variety of suitable components. The components of the industrial automation system may include various industrial equipment loads such as mixers, machine conveyors, tanks, skids, specialized original equipment manufacturer machines, fire suppressant system, and the like. The components may also be associated with devices used by the equipment such as scanners, gauges, valves, flow meters, and the like. In one embodiment, every aspect of the component may be controlled or operated by a single controller (e.g., control system). In another embodiment, the control and operation of each aspect of the component may be distributed via multiple controllers (e.g., control system). As such, the processing modules 12 may control one or more aspects of the load 36.

Components (e.g., load 36, component loads, processing components) of the industrial automation system 32 may be used within a corresponding cell, area, or factory of an industrial automation system to perform various operations for the respective cell, area, or factory. In certain embodiments, the components may be communicatively coupled to each other, to an industrial control system via communication bus 14, to an industrial control system via the processing modules 12A, to an industrial control system via the processing module 12B, or the like. Additionally, the industrial control system may also be communicatively coupled to one or more control systems that may monitor and/or control the operations of each respective cell, area, or factory.

As such, the industrial control system may include a computing device that has communication abilities, processing abilities, and the like. For example, the industrial control system may at least partially include the processing modules 12 and/or may include a controller (e.g., control system), such as a programmable logic controller (PLC), a programmable automation controller (PAC), or any other controller that may monitor, control, and operate an industrial automation device or component. The industrial control system may be incorporated into any physical device (e.g., the industrial automation components) or may be implemented as a stand-alone computing device (e.g., general purpose computer), such as a desktop computer, a laptop computer, a tablet computer, a mobile device computing device, or the like.

Industrial automation components may include a user interface, the industrial control system, a motor drive, a motor, a conveyor, and any other device that may enable an industrial automation system to produce or manufacture products or process certain materials. In addition to the aforementioned types of industrial automation components, the industrial automation components may also include controllers, input/output (IO) modules, motor control centers, motors, human machine interfaces (HMIs), user interfaces, contactors, starters, sensors, drives, relays, protection devices, switchgear, compressors, network switches (e.g., Ethernet switches, modular-managed, fixed-managed, service-router, industrial, unmanaged, etc.), and the like. The industrial automation components may also be related to various industrial equipment such as mixers, machine conveyors, tanks, skids, specialized original equipment manufacturer machines, and the like. The industrial automation components may also be associated with devices used in conjunction with the equipment such as scanners, gauges, valves, flow meters, and the like.

The sensing devices 34 may sense parameters of the load 36 and/or of ambient conditions 42 of the load 36. The sensing devices 34 may acquire the sensed data and may output the sensed data to the processing modules 12 via the IO blocks 16. The sensed data may be of any suitable format, and thus may include one or more analog electrical signals, digital data signals, pulse-width-modulated data signals, or the like. Furthermore, the IO blocks 16 may be outfitted for wireless communication in addition to or instead of wired communication. Thus, the sensed data may sometimes be transmitted to the distributed processing system 10 via wireless and/or radio frequency signals.

After the distributed processing system 10 receives the sensed data from the sensing devices 34, the respective processing modules 12 within the distributed processing system 10 may analyze the sensed data to determine one or more outputs to send to the load 36. In some cases, this includes provision of current from the IO power processing modules 12C, which may be coupled to the load 36 as a redundant pair. The IO power processing modules 12C may provide current concurrently to the load 36. As such, to test output currents from one of the IO power processing modules 12C, one of the IO power processing modules 12C may provide power to the load 36, while the other IO power processing modules 12C does not. As a result, the load 36 may connect to the IO power processing modules 12C and avoids an increased risk of failure if the connected IO power processing module 12C is unable to provide the appropriate power. With this in mind, the present embodiments described below include testing circuitry that may facilitate testing of load current outputs from the redundant IO power processing modules 12C without changing an operation of the load 36. That is, these testing operations do not use the load 36, and thus do not use signals sensed while the load 36 is turned on when normally off or being turned off when normally on.

Figure 3:
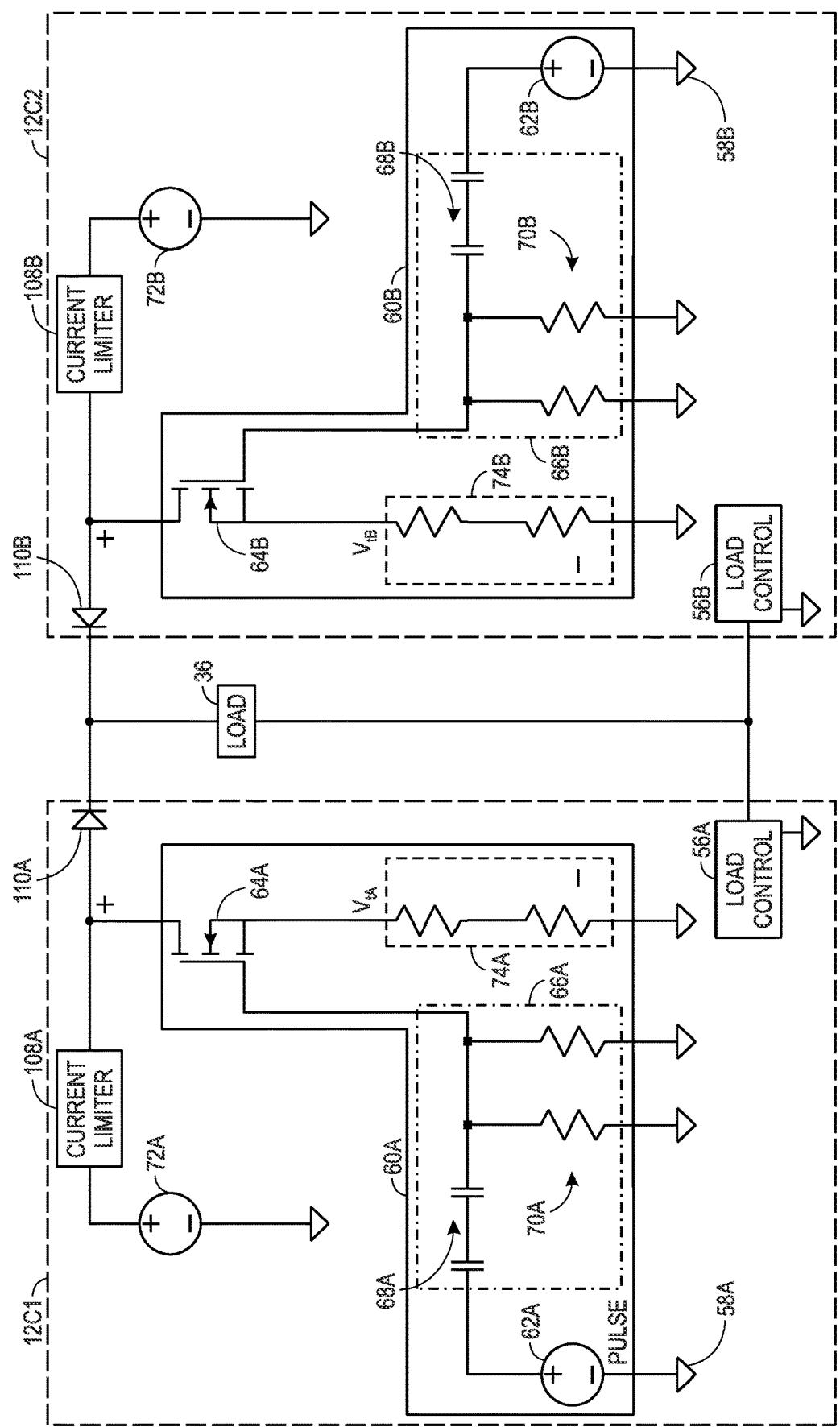
FIG. 3 is a circuit diagram of a pair of IO power processing modules of FIG. 2 coupled to supply power to the load of FIG. 2, in accordance with an embodiment.
Figure 4:
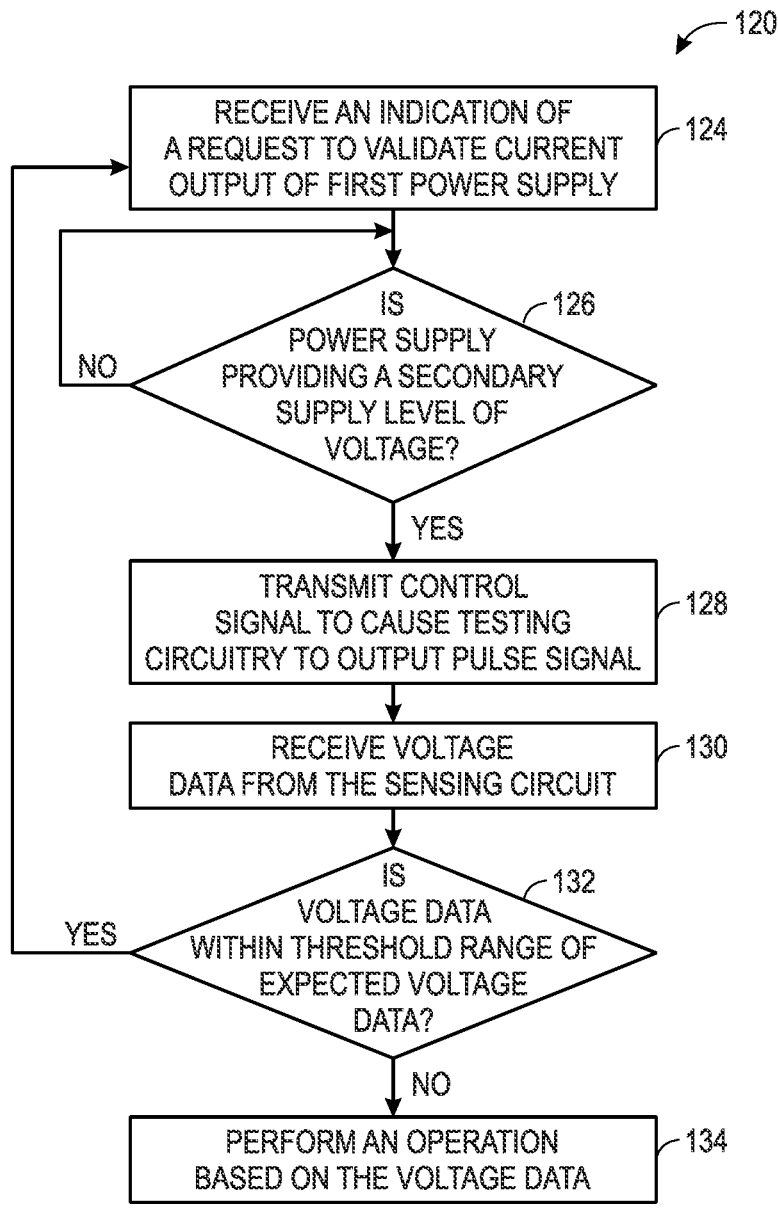
FIG. 4 is a flow diagram of a process for operating a control system to test a load current of a respective IO power processing module of FIG. 2 without powering the load of FIG. 2, in accordance with an embodiment.

As discussed above, two or more power-supplying processing modules may be arranged to provide power to a shared or common load. FIGS. 3 and 4 correspond to load current testing of a redundant pair of the IO power processing modules 12C1, 12C2 from FIG. 2. FIGS. 3 and 4 are discussed relative to two IO power processing modules 12C. It should be understood that some examples may use more than two coupled similarly as described herein to isolate testing operations from power-supplying operations. For example, three or more IO power processing modules may couple to the same shared load via respective diodes with the cathode-side coupled to the shared load. Before continuing, it should be noted that FIG. 3 is one example of an implementation. That is, other suitable circuits may be used to implement the operations performed by the circuit depicted in FIG. 3.

Referring now to FIG. 3, FIG. 3 is a circuit diagram of a pair of IO power processing modules 12C (e.g., IO power processing module 12C1, IO power processing module 12C2) coupled to supply power to the load 36. The IO power processing modules 12C may concurrently supply power to the load 36 via voltage supply 72A and voltage supply 72B. At any given time, one of the IO power processing modules 12C may be operated in a primary supply mode, and the other may be operated in a secondary supply role (e.g., secondary supply mode). In some systems, each of the IO power processing modules 12C may alternate between both operating in the primary supply mode and the secondary supply mode. While operating in the secondary supply mode, the respective IO power processing module may have its output current validated (e.g., confirm that output current is greater than or equal to desired load current) without interrupting the supply of power from the other IO power processing module to the load 36.

The IO power processing modules 12C1 and 12C2 may include testing circuitries 60A and 60B, respectively. The testing circuitries 60A and 60B may include or be coupled to a voltage supply 62A and 62B that supplies electrical signals to a switch 64A and switch 64B (e.g., switches 64 collectively), respectively. In some embodiments, the voltage supply 62A and 62B may include a control system, a controller, a microcontroller, a microprocessor, or other suitable control device to control the operation of the voltage supply 62A and 62B. By way of example, a control signal may be transmitted to the IO power processing module 12C1 from the processing module 12B, a control system, a testing control system, a microprocessor of voltage supply 62A, or other control circuitry to cause the voltage supply 62A to output a pulsed voltage to switch 64A. As a result, the switch 64A may close and couple the corresponding voltage supply 72A to a ground node 58A (e.g., ground terminal) via the resistors 74A.

The pulsed voltage may be provided to a gate of the switch 64A via timing circuitry 66A. The switch 64 may be any suitable type of switch, such any suitable transistor or the like. As mentioned above, the switch 64 may close when the pulsed voltage signal transmitted from the voltage supply 62 via the timing circuitry 66 has a suitable voltage level relative to operate the switch 64.

The timing circuitry 66 may include capacitors 68 and resistors 70 to form a resistor-capacitor (RC) circuit characterized by a time constant time period formed from values of the capacitors 68 and the resistors 70. In this example, the capacitors 68 may each have a capacitance value between 0.05 microFarads (µF) and 2 µF and the resistors 70 may each have a resistance value of 200 kiloohms (kΩ) and 300 kΩ, but it should be noted that other suitably sized capacitors and resistors may be used to generate a desired time constant of decay. The one or more capacitors 68 and/or the one or more resistors 70 may have any suitable value, for example, the capacitors 68 may each have a capacitance value between 0.009 µF and 0.011 µF and the resistors 70 may each have a resistance value between 230.0 kΩ and 240.0 kΩ (e.g., 237 kΩ).

Capacitive coupling associated with the timing circuitry 66 may prevent firmware from attempting to apply the load for more than a threshold amount of time. Indeed, the time constant of the RC circuit formed from the capacitors 68 and the resistors 70 may limit an amount of time in which the pulsed voltage signal may be provided to the gate of the switch 64 from the voltage supply 62. That is, if firmware or control system operations cause the control signal to be provided to the voltage supply 62 for more than a threshold amount of time, the RC circuit may limit the pulsed voltage signal provided to the switch 64 to the threshold time via attenuation. In this way, the test circuitry 60 may attenuate a control signal used to close the switch 64 after a duration of time equal to the threshold amount of time.

After closing, as mentioned above, the switch 64 transmits current based on a voltage output from a voltage supply 72 of the IO power processing module 12C and a load provided by the resistors 74 coupled to the switch 64. In this example, the resistors 74 provide a total of between 9 ohms (Ω) and 13 Ω (e.g., 11.2 Ω) of resistance, but it should be noted that any suitably sized load may be used for testing based on the size of resistance used as resistors 74. Indeed, the two resistors may each have a resistance between 4.0 Ω and 6.0 Ω (e.g., 5.6 Ω). A sensing circuit may sense the voltage (Vt) across the resistors 74 and switch 64, and the control system may use the sensed voltage to determine the load current from the IO power processing module 12C.

In some embodiments, the IO power processing modules 12C may each include a current limiter 108. The current limiters 108 may include respective switches that turn on to provide current and voltage to the load 36. These current limiters 108 may also respectively monitor currents from the voltage supplies 72. The current limiter 108 may also include a fuse, detection circuitry, or other suitable circuit-protection components to help prevent current exceeding some threshold amount from being provided to the load 36. When the current value is greater than or equal to the threshold value, the current limiter 108 may open and isolate the load 36 from the voltage supplies 72.

As discussed above, to ensure that the current limiters 108, the voltage supplies 72, or another portion of the IO power processing modules 12C operates according to certain expected boundaries, the present embodiments described below may be used to regularly or periodically test the ability of each of the IO power processing modules 12C to supply the threshold amount of current to the load 36.

With this in mind, testing circuitry 60 (testing circuitry 60A, testing circuitry 60B) in each of the IO power processing modules 12C may allow the control system to detect whether the IO power processing modules 12C are capable of providing a load current to the load 36 at various times (e.g., different times). In particular, testing circuitry 60 may perform a load current test for the IO power processing modules 12C while avoiding providing a test load current to the load 36 and allowing the load 36 to continue its operation. That is, one of the IO power processing modules 12C may be tested with respect to its current output capabilities, while the other IO power processing module 12C may provide a load current to the load 36 to allow the load 36 to continue to operate. In addition, the ability of the IO power processing modules 12C to provide current may be tested using the testing circuity 60 even when the load 36 is off. In other words, the load 36 does not have to be turned on to test the capability of the IO power processing modules 12C to deliver current.

To elaborate, the IO power processing module 12C1 may be equipped to provide the same load current as the IO power processing module 12C2. As such, at times, the IO power processing module 12C1 may provide a load current to the load 36, while the IO power processing module 12C2 may not provide any power or load current to the load 36. In other instances, the load 36 may receive current from both IO power processing modules 12C. In yet another example, the current provided to the load 36 may be toggled between the IO power processing module 12C1 and the IO power processing module 12C2. When providing load current to the load 36 from one of the IO power processing modules 12C, the supplying IO power processing module may be considered a primary IO power processing module, and the other idle IO power processing module may be considered a redundant IO power processing module. When concurrently providing load current for the load 36 from the IO power processing modules 12C, the IO power processing module 12C1 and IO power processing module 12C2 may alternate between a primary supply role and a secondary supply role. While operated in the secondary supply role, the processing module 12B may perform background operations on the respective of the IO power processing modules 12C without interrupting the full power amount being supplied to the load 36 by the other of the IO power processing modules 12C. The background activities may involve performance verification operations, testing operations, or diagnostic operations, which may include load current output verification operations performed using the testing circuitry 60.

When operated in the secondary supply role, a respective of the IO power processing modules 12C may output less current as compared to the IO power processing module 12C operating in the primary supply role. When operating in the primary supply role, a respective one of the IO power processing modules 12C may output a full amount of output current to the load 36 (e.g., rated load current for the load 36). The testing circuitry 60 may include diodes 110 (diode 110A, diode 110B) to prevent currents from conducting to an opposite IO power processing module 12C.

The diodes 110 are coupled such that the cathode-side of the diodes 110 couples to the load 36 and the anode-side of the diodes 110 are coupled to the corresponding current limiter 108. A respective IO power processing module 12C may supply current to the load 36 via a coupling to an anode of the respective diode 110. With this in mind, by way of example, when the IO power processing module 12C2 is providing a lower current output (e.g., secondary supply role) as compared to the IO power processing module 12C1, the IO power processing module 12C2 may output a voltage that is lower than the IO power processing modules 12C1. As a result, the diode 110B may become reverse-biased and block current from transmitting through the diode 110B back to the voltage supply 72B or the testing circuitry 60B.

To perform a load current test on a particular IO processing power module 12C, the operation of the testing circuitry 60 will be described assuming that the IO power processing module 12C1 is operating as the primary supply role and the IO power processing module 12C2 may be operating in a secondary supply role. However, it should be noted that embodiments described herein may be implemented in the reverse.

Assuming that the IO power processing module 12C2 is operating in the secondary supply role, the load 36 may receive the desired load current from the IO power processing module 12C1 independently. As such, the IO power processing module 12C2 may be tested to validate that it can produce a threshold amount of current sufficient to independently power the load 36. In some embodiments, a control system, such as the processing module 12B, may be used to initiate the test of the IO power processing module 12C2, while allowing the load 36 to continue its regular or scheduled operations.

By way of operation, the control system may transmit a control signal to a circuit component (e.g., switch) of the testing circuitry 60B to couple the voltage supply 62B to the switch 64B. As a result, the switch 64B may close and couple the voltage supply 72B to ground via resistors 74B. The current output via the voltage supply 72B may generate a voltage (VtB) across the resistors 74B. The voltage (VtB) across the resistors 74B may be sensed by the control system and correlated to a current measurement based on the resistance characterizing the resistors 74B. The control system may then compare the calculated current to a threshold current amount corresponding to a rated output current for the IO power processing module 12C2. Deviations from the threshold current amount (e.g., higher or lower than the threshold current amount by a defined margin or percentage of deviation) may cause the control system to generate an alert or a notification to allow an operator to become aware of the deviation. In some embodiments, the control system may adjust an operation of the load 36 to operate such that the calculated current is sufficient to perform its operation.

To help explain, FIG. 4 is a flow diagram of a process 120 for operating a control system, such as the processing module 12B, to test the load current of a respective of the IO power processing modules 12C without turning on or turning off the load 36. The process 120 may be performed by the processing module 12B, another control system associated with the distributed processing system 10, or the like in response to executing instructions stored in a tangible, non-transitory, computer-readable medium, such as a memory of the processing module 12B or another suitable memory. Moreover, the operations of the process 120 are shown in a particular order; however, some of the operations may be performed in a different order than what is presented. Certain voltage and current values are described herein, but it should be understood that these are example values and example ranges, which may be adjusted for specific systems and implementations.

At block 124, the processing module 12B may receive a request to validate current output from the IO power processing module 12C1 or the IO power processing module 12C2. For ease of discussion, operations of the process 120 are described in terms of IO power processing module 12C2 being tested, and it should be understood that these descriptions apply similarly to both IO power processing modules 12C. The request may be generated by an application run on firmware of the processing module 12B to track operational intervals (e.g., when a respective of the IO power processing modules 12C is operated into the secondary supply role) of the IO power processing module 12C1, the IO power processing module 12C2 or both. Sometimes the processing module 12B may receive the request via an IO block 16, such as from another processing module 12, from an external device, user, via the communication bus 14, or the like.

At block 126, the processing module 12B may determine whether a power supply (e.g., the IO power processing module 12C2) provides a secondary supply level of voltage to the load 36. This check determines if the IO power processing module 12C2 is being operated in its secondary supply role and thus eligible to have its load current output tested. To do so, the processing module 12B may receive voltage data sensed across the current limiter 108B, the voltage supply 72B, or another suitable portion of circuitry of the IO power processing module 12C2. The voltage data may be compared by the processing module 12B to a voltage threshold amount to determine whether the voltage data value indicates that the IO power processing module 12C2 provides the secondary supply level of voltage to the load 36. For example, a primary supply level of voltage may equal 24V or a value between 22V and 26V, and the secondary supply level of voltage may equal 20V or a value between 18V and 22V. In response to determining that the IO power processing module 12C2 is not providing a secondary supply level of voltage to the load 36, the processing module 12B may repeat determination operations of block 126 until the IO power processing module 12C2 provides a secondary supply level of voltage.

However, in response to determining that the IO power processing module 12C2 provides a secondary supply level of voltage to the load 36, the processing module 12B may, at block 128, transmit a control signal to the IO power processing module 12C2 to cause the testing circuitry 60B to output the pulsed voltage signal transmitted from the voltage supply 62B. After the switch 64B receives the pulsed voltage signal transmitted from the voltage supply 62B, sensing circuitry, such as the sensing device 34, may sense the voltage (VtB) across the resistors 74B. At block 130, the processing module 12B may receive voltage data from a sensing device, such as the sensing device 34, a duration of time after transmitting the control signal.

In response to receiving the voltage data, the processing module 12B may, at block 132, determine whether the voltage data is within a threshold range of an expected voltage data value. The expected voltage data value may equal or be based on a voltage determined from multiplying the current value that the IO power processing module 12C2 is rated for (or desired to output at) by the resistance of the resistors 74B. The target current value may correspond to the rated current value of the IO power processing module 12C2 or be within a threshold range from the rated current value. In some cases, this may also include recording the voltage data in a historical log of data.

If the processing module 12B determines that the voltage data is within the threshold range or equal to the expected voltage data, the processing module 12B may record the data value and wait for a next instruction to repeat the operations (e.g., at block 124). However, if the processing module 12B determines that the voltage data is outside or not within the threshold range of the expected voltage data, the processing module 12B may, at block 134, perform an operation based on the voltage data. As part of the operation, the processing module 12B may adjust an operation of the distributed processing system 10 and/or may generate an alarm signal or otherwise alert another control system or an operator. The processing module 12B may generate alert data indicative of the IO power processing module 12C2 not outputting current according to its rated current value, such as alert data that triggers generation of a graphic or indication on a graphical user interface.

It is noted that a control system, such as the processing module 12B, may test the output current of the IO power processing module 12C1 at a different starting time than the test performed on the IO power processing module 12C2. Furthermore, after determining one of the IO power processing modules 12C to be in a secondary supply role (e.g., being the secondary power supply), the control system may repeat causing the testing circuitry 60 to couple the voltage supply 72 to the resistors 74, and thus repeat testing an output current from the voltage supply 72. The repeat testing may occur periodically or at set intervals to confirm that the IO power processing module 12C is able to provide rated amounts of current. The repeated determination may skip or delay testing of the other IO power processing module 12C in a primary supply role when other IO power processing module 12C is determined to actively provide a current signal to the load 36. In this way, one or more of the IO power processing modules 12C may be tested two or three times (or more) between each testing of the other of the IO power processing modules 12C.

The control system may include a processor and may be considered an electronic device that has input/output devices, memories, and the like. The control system may, thus, include a tangible, non-transitory computer-readable medium that stores instructions executable by the processor that, when executed by the processor, cause the processor to perform various operations, such as testing output currents of power IO modules (e.g., IO power processing modules). Furthermore, the IO power processing modules may be considered power devices. Similarly, these systems and methods may apply to other power devices that supply a load that is undesired to be turned on or turned off for testing, such as any suitable analog or digital power supply, power bus connection, or the like. Moreover, it is noted that each power device or the IO power processing module may be desired to output current at a rated current value, and each rated current value may correspond to a rated voltage value.

To elaborate further on testing operations and the diodes 110, the IO power processing modules 12C may couple to the load 36 via the one or more diodes 110 arranged anode-side toward the voltage supply 72. In this way, the respective IO power processing module 12C supplies current to the load 36 via a coupling to an anode of the respective diode 110. For example, the IO power processing module 12C1 may output current via a path coupled to an anode of the diode 110A, which outputs current via a cathode to a load 36 and a cathode of the diode 110B, which may be in a reverse bias state to block the current from transmitting via the diode 110B. The diode 110B may couple at its anode to a path used by the IO power processing module 12C2 to transmit its output current to the load 36, which may be shared by both the IO power processing modules 12C coupled as a redundant pair or a concurrent pair. Indeed, the diodes 110 may be coupled to each other at the cathodes and thus be coupled reversely to each other. When the anodes are at the same voltage level, both diodes permit current to transmit from the respective IO power processing modules 12C to the load 36. However, when one of the IO power processing modules 12C enters into an operational testing mode and reduces its output current to the load 36, its corresponding diode 110 becomes reverse biased and blocks current from the other one or more IO power processing modules 12C. Thus, this arrangement temporarily isolates the module-under-test from the other IO power processing modules 12C to reduce the likelihood that currents of the testing operation interfere with operations of load 36. That is, reduce a likelihood of or prevent interfering with an ongoing operational state of the load 36, such as normally off or normally on, thereby improving testing operations by enabling online testing of a redundant pair of IO power modules without using the operation of the load 36 in performing the online testing.

During non-testing operation, both the primary IO power processing module 12C1 and the secondary IO power processing module 12C2 may supply the same or substantially similar amount of voltage to the shared load 36, for example 24 volts (V). However, to enter a testing mode to test the secondary IO power processing module 12C2, a control system may operate the secondary IO power processing module 12C2 into a reduced voltage state to trigger isolation of the output of the secondary IO power processing module 12C2 from the shared load 36 for a duration of time. For the duration of time, the primary IO power processing module 12C1 may supply a higher amount of voltage to the shared load than the secondary IO power processing module 12C2, for example 24V versus 20V, which permits the secondary IO power processing module 12C2 to be tested without interfering with the supply of power to the shared load 36. It is noted that during the testing operation, the operational state of the shared load 36 is not changed. That is, when the shared load 36 is turned off waiting to be turned on, then the testing operation does not turn the shared load 36, or when the shared load 36 is turned on, then the testing operation does not turn off the shared load. Thus, online current output validation operations may occur without impact to normal process and/or an operational state of the load 36.

Thus, these systems and methods may be useful in a wide variety of applications to improve testing operations. For example, a system when a normally off load 36 is desired to be supplied power from primary and secondary IO power processing modules 12C, the testing systems and methods described herein may be used to validate that a current output matches or is substantially similar to (within a threshold of) a rated current output of the IO power processing modules 12C. In another system, a normally on load 36 may be desired to be supplied power from primary and secondary IO power processing modules 12C, the testing systems and methods described herein may be used to verify operation of either or both of the IO power processing modules 12C to validate that a current output matches or is substantially similar to (within a threshold of) a rated current output of the IO power processing modules 12C. Indeed, these systems and methods may be used in systems with concurrent power supplies, redundant power supplies, backup power supplies, power supplies implemented as IO power processing modules or as other power delivering circuitry, or other similar circuitry to improve how load currents are tested in systems where operation of a load is desired to be unchanged or uninterrupted.

Technical effects of the systems and methods described herein include online current testing systems and methods that use circuitry other than a load to test an online load current. When a system (e.g., IO power processing module) is desired to reliably energize a load at command, it may be desired to test the system to verify that it is able to output a load current at a current value. Furthermore, using a testing method that does not rely on turning on the load may further benefit systems used in applications that are tested by turning on the load, such as fire suppressant systems. Thus, systems and methods described herein test a load current supplied by the system without turning on or turning off the load. These systems and methods use a pulsed control signal to activate a switch for a relatively short time period to redirect a supplied voltage from a load supply to a resistance. The voltage transmitted via the resistance is sensed and correlated to the load current of the system under test. Based on the value of the load current of the system under test, the current testing system may validate the system when generating current at its rated current value or reject the system when not generating current at its rated current value or a threshold of the rated current value. Systems and methods described herein not only detect when a voltage supply is not generating a rated amount of voltage but may also detect when other components of the system are not operating according to its rated performances. The testing circuitry described may also include series capacitors coupled to parallel resistors to form timing circuitry. This timing circuitry has a time constant that may cause a pulsed voltage signal transmitted from the voltage supply of the testing circuitry for a duration of time longer than desired to decay to at most negligibly affect downstream circuitry. This decay may improve the resiliency of the testing circuitry and may reduce a likelihood of a firmware misoperation at an upstream control system damaging the testing circuitry and/or the system under test by applying the testing voltages for longer than desired. The time constant decay protection may also permit the use of smaller resistances within the testing circuitry since the testing pulse has a programmed pulse duration based on the time period it is applied and/or the time constant corresponding to the capacitance and resistance of the testing circuitry. Furthermore, the operation is additionally improved when using the testing circuitry with concurrent or redundant power supplies since reverse-biasing of diodes may help isolate a primary power supply from the power supply under test.

While only certain features of the disclosure have been illustrated and described herein, many modifications and changes will occur to those skilled in the art. It is, therefore, to be understood that the appended claims are intended to cover all such modifications and changes as fall within the true spirit of the disclosure.

The invention claimed is:

1. A system, comprising:
 a first voltage supply configured to supply an output current to a load;
 testing circuitry coupled to the first voltage supply, wherein the testing circuitry comprises:
  a second voltage supply;
  a switch configured to close in response to a voltage signal from the second voltage supply; and
  a current measurement circuit configured to couple to the switch, wherein the current measurement circuit is configured to receive the output current from the first voltage supply while the switch is closed; and
 a control system configured to:
  receive an indication of a voltage across the current measurement circuit while the switch is closed from a sensing circuit;
  determine an amount of current present in the output current based on a resistance value associated with the current measurement circuit and the voltage; and
  perform an operation based on the amount of current.

2. The system of claim 1, wherein the control system is configured to:
 compare the amount of current to a rated output current associated with the first voltage supply; and
 perform the operation based on the amount of current being within a threshold amount with respect to the rated output current.

3. The system of claim 1, comprising a current limiter and a diode, wherein:
 an input to the current limiter is coupled to the first voltage supply;
 an output from the current limiter is coupled to an anode of the diode; and
 the load is coupled to a cathode of the diode.

4. The system of claim 1, wherein the testing circuitry comprises a timing circuit configured to limit an amount of time in which the voltage signal is applied to the switch.

5. The system of claim 4, wherein the timing circuit comprises at least one capacitor and at least one resistor associated with a time constant time period.

6. The system of claim 1, comprising:
 a third voltage supply, wherein the third voltage supply is configured to couple to the load; and
 a second testing circuitry, wherein the second testing circuitry is configured to test a second output current from the third voltage supply at a different time than the testing circuitry.

7. The system of claim 6, wherein the control system is configured to:
 determine that the third voltage supply is operating in a secondary supply role; and
 in response to the third voltage supply being operated in the secondary supply role:
  cause the second testing circuitry to couple the third voltage supply to one or more second resistors via a second switch a plurality of times; and
  determine whether a second amount of current present in the second output current is within a threshold amount of a rated output current associated with the third voltage supply.

8. The system of claim 7, wherein the first voltage supply is configured to output the output current to the load while the second testing circuitry determines whether the second amount of current is within the threshold amount of the rated output current.

9. The system of claim 1, wherein the current measurement circuit comprises one or more resistors.

10. A test circuit, comprising:
 a voltage supply;
 a switch configured to close in response to receiving a voltage signal from the voltage supply;
 a timing circuit coupled to the voltage supply and a ground terminal, wherein the timing circuit is configured to limit an amount of time that the voltage signal is provided to the switch; and
 a current measurement circuit configured to couple to the switch, wherein the current measurement circuit is configured to receive an output current from an additional voltage supply while the switch is closed during the amount of time, and wherein the additional voltage supply is configured to provide power to a load.

11. The test circuit of claim 10, wherein the timing circuit comprises at least one capacitor and at least one resistor associated with a time constant time period that is configured to limit the amount of time in which the voltage signal is applied to the switch.

12. The test circuit of claim 11, wherein the current measurement circuit comprises one or more resistors.

13. The test circuit of claim 12, wherein the switch is configured to couple to a first resistor of the one or more resistors, and wherein the first resistor is configured to couple in series to a second resistor of the one or more resistors, wherein the second resistor is coupled to the ground terminal.

14. The test circuit of claim 10, wherein the switch is configured to couple to an anode of a diode coupled to the additional voltage supply via a current limiter.

15. A tangible, non-transitory computer-readable medium configured to store instructions executable by a processor of an electronic device that, when executed by the processor, cause the processor to:
 receive an indication of a request to validate an output current of a first input/output (TO) power supply module configured to couple to a load;
 close a switch for a duration of time in response to the indication of the request;
 detect a voltage across one or more resistors coupled between the switch and a ground terminal;
 determine an amount of current present in an output current transmitted via the one or more resistors based on a resistance value of the one or more resistors and the voltage; and
 transmit a notification in response to a difference between the amount of current and a rated output current being greater than a threshold amount.

16. The tangible, non-transitory computer-readable medium of claim 15, storing instructions that, when executed by the processor, cause the processor to compare the amount of current to the rated output current of a voltage supply of the first TO power supply module.

17. The tangible, non-transitory computer-readable medium of claim 15, storing instructions that, when executed by the processor, cause the processor to close an additional switch in response to another indication of a request to validate an additional output current of a second TO power supply module.

18. The tangible, non-transitory computer-readable medium of claim 17, wherein a voltage supply of the first TO power supply module is configured to output the output current to the load while the additional switch of the second TO power supply module is closed.

19. The tangible, non-transitory computer-readable medium of claim 15, storing instructions that, when executed by the processor, cause the processor to, in response to receiving the indication of the request, causing transmission of a voltage pulse to the switch, wherein the voltage pulse is configured to close the switch for the duration of time.

20. The tangible, non-transitory computer-readable medium of claim 15, wherein the first IO power supply module is configured to attenuate a control signal used to close the switch after the duration of time.

* * * * *